(12) United States Patent
Toda

(10) Patent No.: US 6,271,145 B1
(45) Date of Patent: Aug. 7, 2001

(54) METHOD FOR MAKING A MICROMACHINE

(75) Inventor: Risaku Toda, Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/451,299

(22) Filed: Nov. 30, 1999

(30) Foreign Application Priority Data

May 31, 1999 (JP) .................................................. 11-151865

(51) Int. Cl.[7] .......................... H01L 21/302; H01L 21/461
(52) U.S. Cl. ............................. 438/706; 438/719; 438/723
(58) Field of Search .................................... 438/706, 719, 438/723, 50, 48, 49; 257/415, 254, 417, 421

(56) References Cited

U.S. PATENT DOCUMENTS

| Re. 31,473 | 12/1983 | Kilby et al. ................................ 425/6 |
| 3,787,718 | * 1/1974 | Patterson ............................ 317/234 R |
| 5,462,639 | 10/1995 | Matthews et al. .................. 156/662.1 |
| 5,536,963 | * 7/1996 | Polla ..................................... 257/417 |
| 5,726,480 | 3/1998 | Pister ..................................... 257/415 |
| 5,955,776 | * 9/1999 | Ishikawa ............................... 257/618 |
| 6,055,928 | * 5/2000 | Murzin et al. .................... 118/723 E |
| 6,197,610 | * 3/2001 | Toda ....................................... 438/50 |
| 6,204,545 | * 3/2001 | Nakata ................................. 257/459 |

FOREIGN PATENT DOCUMENTS 2-119241   10/1988   (JP) .

* cited by examiner

*Primary Examiner*—Benjamin L. Utech
*Assistant Examiner*—Duy-Vu Deo
(74) *Attorney, Agent, or Firm*—Haynes and Boone LLP

(57) ABSTRACT

A method for making a micromachine, which includes a spherical body and a spherical shell surrounding said spherical body, comprising forming a victim layer on said spherical body to coat said spherical body, forming a function layer on said victim layer, said function layer including at least one conductive material pattern and/or insulating material layer, forming a structure layer of insulating material to coat said spherical body on which said function layer is formed, forming etching bores extending from the outer surface of said structure layer to said victim layer, and introducing gaseous etchant into said etching bores to remove said victim layer.

9 Claims, 6 Drawing Sheets

METHOD FOR MAKING A MICROMACHINE

This application claims the priority of Japanese Application No. P11-151872 filed on May 31, 1999.

FIELD OF THE INVENTION

The present invention relates to a method for making a micromachine or spherical sensor type measuring apparatus consisting of a microspherical sensor portion and a surrounding portion or surrounding electrodes which surrounds the sensor portion, particularly, a method for making a microspherical body having a diameter of less than several mm meters and micro electrodes.

BACKGROUND OF THE INVENTION

Methods and means have been known for detecting external force, acceleration or the like by electrostatically or magnetically floating up a microspherical body in no contact with the surrounding to detect the displacement of the spherical body. Typically, such means has a microspherical body, an apparatus for generating electric or magnetic field to float up the microspherical body and a pick-up for detecting the displacement of the spherical body. In some cases, the floated microspherical body may be rotated at a high speed.

The apparatus for generating electric or magnetic field and the pick-up for detecting the displacement of the microspherical body have, typically, a plurality of electrodes, which are disposed in close vicinity to the microspherical body.

Conventionally, the microspherical body and the surrounding electrodes have been separately made and assembled. Therefore, no appropriate method for making a microspherical body and surrounding electrodes concurrently and precisely to arrange the two in close vicinity with each other has been known.

In the field of semiconductor device production, many methods and techniques are known for making micro chips and forming microscopic circuit patterns in multi-layers. These methods include, for example, lithography, etching, chemical vapor deposition (CVD), electron beam exposure printing or the like. However, these methods can make plane boards or chips, but cannot make a microspherical body and micro electrodes which are disposed in close vicinity to the microspherical body.

Accordingly, it is an object of the present invention to provide a method for making a microspherical body and micro electrodes which are disposed in close vicinity to the microspherical body precisely and easily.

It is another object of the present invention to provide a method for making a microspherical body and a microspherical shell which surrounds the microspherical body and for forming electrodes on the inner surface of the microspherical shell.

SUMMARY OF THE INVENTION

According to the present invention, there is provided a method for making a micromachine, which includes a spherical body and a spherical shell surrounding said spherical body, comprising; forming a victim layer on said spherical body to coat said spherical body, forming a function layer on said victim layer, said function layer including at least one conductive material pattern and/or insulating material layer, forming a structure layer of insulating material to coat said spherical body on which said function layer is formed, forming etching bores extending from the outer surface of said structure layer to said victim layer, introducing gaseous etchant into said etching bores to remove said victim layer.

Accordingly, a spherical body and a shell surrounding the spherical body can be made at the same time and precisely. Particularly, a microspherical body and a micro shell can be made at the same time and precisely.

Further according to the present invention, said process for forming a function layer comprising; forming conductive material patterns on said victim layer, forming an insulating material layer to coat said conductive material patterns, forming grooves on said insulating material layer to expose said conductive material patterns, forming circuit patterns on said insulating material layer to connect with said conductive material patterns exposed from said insulating material layer.

The method further comprising; forming bores on said structure layer to expose said circuit patterns, forming bumps to connect with said circuit patterns exposed from said structure layer.

Accordingly, a spherical body and electrodes which are positioned in close vicinity to the spherical body can be made at the same time and precisely. Particularly, a microspherical body and micro electrodes can be made at the same time and precisely.

Said etching bores are formed by making bores on the same points in said process for forming a function layer and said process for forming a structure layer. Said etching bores are made after said process for forming a structure layer.

According to the present invention, said victim layer is made of silicon, and said etchant is xenon difluoride. Said structure layer is formed by thermal hardening a thermosetting resin. Said insulating material layer is made of silicon dioxide derived from TEOS.

According to the present invention, there is provided a method for making a spherical body type sensor apparatus, which includes a spherical body and a spherical shell surrounding said spherical body comprising;

forming a victim layer on a spherical body to coat said spherical body, forming electrode patterns of a conductive material on said victim layer, forming an insulating material layer to coat said electrode patterns, forming bores on said insulating material layer to expose said electrode patterns, forming circuit patterns on said insulating material layer to connect with said electrode patterns exposed from said insulating material layer, forming an insulating structure layer to coat said spherical body on which said circuit patterns have been formed, forming a plurality of etching bores extending from the outer surface of said structure layer to said victim layer, introducing gaseous etchant into said etching bores to remove said victim layer.

BEST MODES FOR CARRYING OUT THE INVENTION

Figure 1:
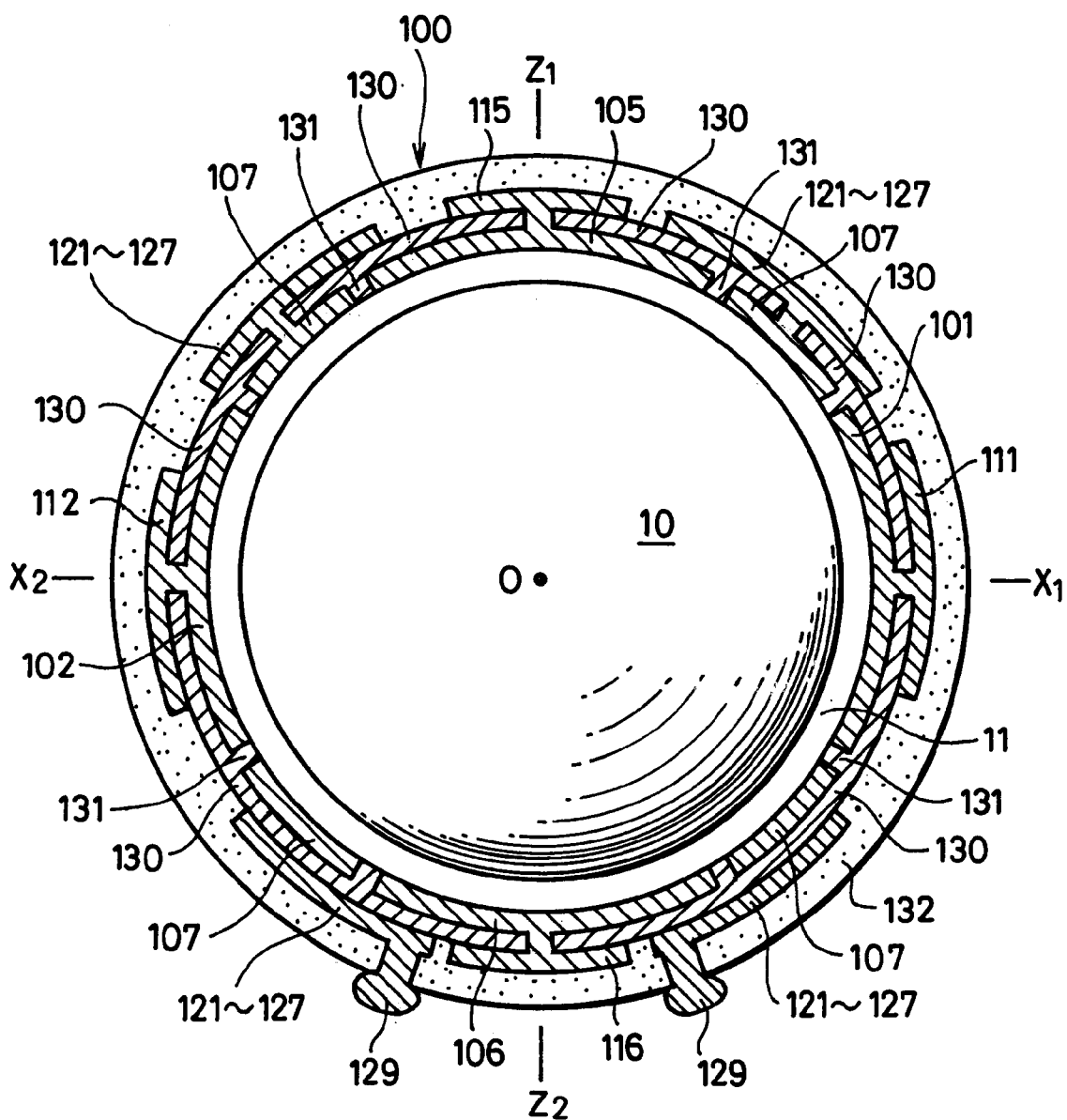
FIG. 1 is a cross sectional view of the micromachine which is made by the method according to the present invention.

Before explaining the production method according to the present invention, referring to FIGS. 1 and 2, the construction of a micromachine or spherical body sensor type measuring means which is made by the production method of the present invention will be described. The present example of micromachine can be used in various ways and fields as a microspherical body type sensor. Examples of floating spherical body type measuring apparatus which is applied to float up a spherical body include accelerator, gyro, or the like. Examples of non-floating spherical body type measuring apparatus include inclinometer. As shown in FIG. 1, the apparatus of the present example has a spherical body 10 and a spherical shell 100 which surrounds the body 10.

The outer diameter of the spherical body 10 is a little smaller than the diameter of the spherical inner surface of the spherical shell 100. When the spherical body 10 is floated up by a suitable way, for example, electrostatic or magnetic method, a cavity or gap 11 is created around the spherical body 10. This gap 11 may be a hermetic space or an open space, and may be evacuated or be filled with an appropriate inert gas or liquid. The diameter of the spherical body 10 is less than several mm meters and, for example, may be 1 mm. The thickness of the gap 11 may be several É m.

The spherical shell 100 includes the innermost electrodes 101–106 and 107 (in FIG. 1, only electrodes 101,102,105, 106 and 107 are shown), subsequent insulating layer 130, further subsequent wiring patterns 111–117 and 121–127, and the outermost structure layer 132. The electrodes 101–106 and 107 are separated from one another by thin insulators 131 which are parts of the insulating layer 130, and each of the electrodes is electrically connected to the corresponding wiring pattern 111–117 or 121–127.

In the meanwhile, on the lower end of the spherical shell 100, bumps 129 are formed. The bumps 129 are mounted to the bores which are formed on the structure layer 132, and are connected to the wiring patterns 111–117 and 121–127.

The electrodes 101–106, 107 and the wiring patterns 111–117 and 121–127 are made of conductive material, for example, metal layer, and the insulating layer 130 and the insulators 131 are made of insulating material, for example, silicon dioxide $SiO_2$. The structure layer 132 is made of insulating material, for example, a thermosetting resin.

In the present embodiment, the thickness of the structure layer 132 is larger than those of the electrodes, wiring patterns and insulating layer. Accordingly, the structure layer 132 serves as a protection layer for protecting the inner components and at the same time, provides the spherical shell 100 with a structural strength.

Figure 2A:
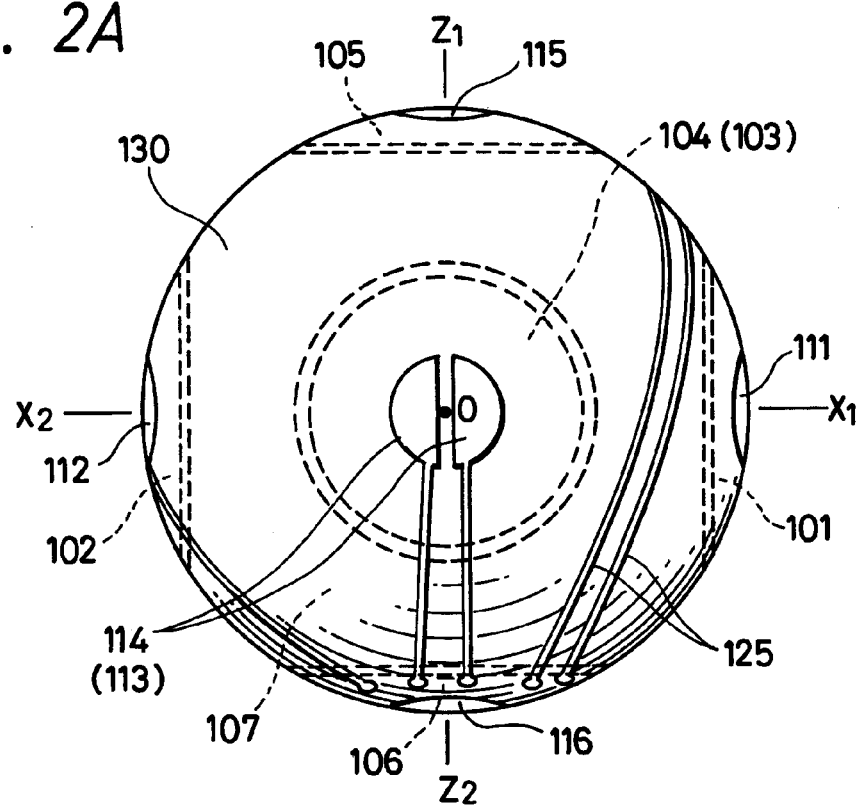
FIG. 2A and FIG. 2B are a front view and a bottom view of the micromachine which is made by the method of the present invention, from which the structure layer has been removed.
Figure 2B:
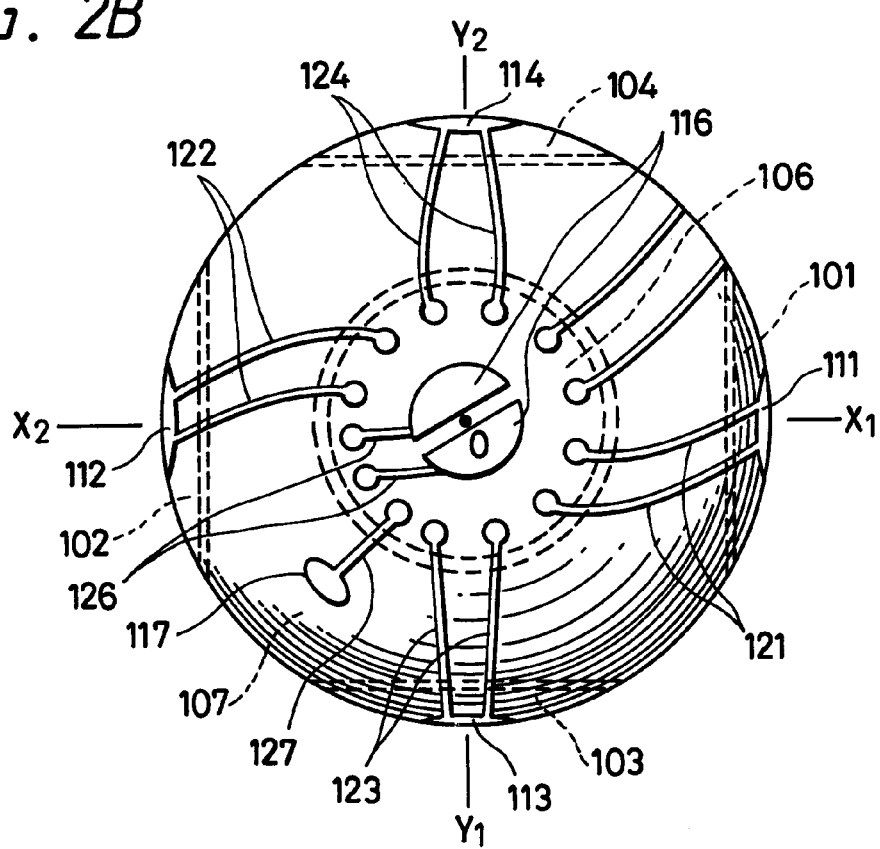

Referring to FIG. 2, the origin O is set at the center of the spherical body 10, and the $X_1$-$X_2$ axis and $Y_1$-$Y_2$ axis are set on a horizontal plane. The $Z_1$-$Z_2$ axis is set vertically. FIG. 2A is a perspective view of the present embodiment as seen along the $Y_1$ axis and FIG. 2B is a perspective view of the present embodiment as seen along the $Z_2$ axis. FIG. 1 shows a cross sectional view of the present embodiment as taken along the vertical plane X-Z.

FIG. 2 is a perspective view of the spherical shell 100 of the micromachine of FIG. 1, from which the structure layer 132 has been removed. As indicated by dotted lines, electrodes include six electrodes 101–106 which are positioned along the orthogonal coordinates and a shield electrode 107 which is positioned among these electrodes. Six electrodes 101–106 are circular and the remainder part is the shield electrode 107.

Six electrodes 101–106 may be used for power and control, and the shield electrode 107 may be used for the ground.

On the outer surface of the insulating layer 130, wiring patterns 111–117 and 121–127 are formed as described above. The wiring patterns include, as shown in the drawing, terminal patterns 111–116, 117 which are connected to the electrodes 101–106, 107 and circuit patterns 121–126, 127 which extend from these terminal patterns 111–116, 117 (FIG. 2B).

As shown in FIG. 2B, the ends of these circuit patterns 121–126, 127 are concentrated on the lower part of the spherical shell 100. The ends of the circuit patterns 121–126, 127 are, for example, as shown in the drawing, positioned along a circle. The ends of the circuit patterns 121–126, 127 are connected to the bumps as shown in FIG. 1.

Each of the electrodes 101–106 consists of a pair of electrode portions, although not shown in the drawing, and therefore each of the wiring patterns 111–116 and 121–126 which are connected to the electrodes 101–106 consists of a pair of wiring patterns.

The shield electrode 107 consists of a single electrode and each of the wiring patterns 117 and 127 which are connected to the shield electrode consists of a single pattern.

Figure 3A:
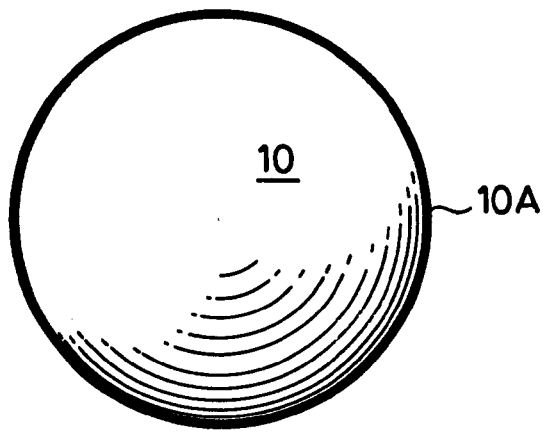
FIG. 3A, FIG. 3B and FIG. 3C are illustrative diagrams showing processes of the method according to the present invention.

Referring to FIG. 3, FIG. 4 and FIG. 5, the production method according to the present invention will be described. Firstly, as shown in FIG. 3A, a spherical body 10 made of polycrystal or single crystal silicon (Si), preferably, single crystal silicon is prepared and a conductive material coating 10A, for example, a metal coating is formed on the surface thereof.

However, if the spherical body 10 is made of any conductive material other than simple substance silicon, the conductive material coating 10A is not necessary. This is the spherical body shown in FIG. 1.

Figure 3B:
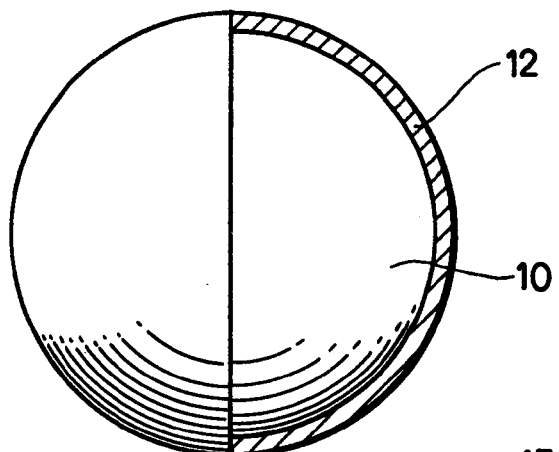

Subsequently, a silicon (Si) layer 12 is formed on the surface of the spherical body 10, as shown in FIG. 3B. The conductive material coating 10A and the silicon layer 12 may be formed by chemical vapor deposition (CVD). The silicon layer 12 is referred to as "dummy layer" or "victim layer", because it is to be removed later.

Figure 3C:
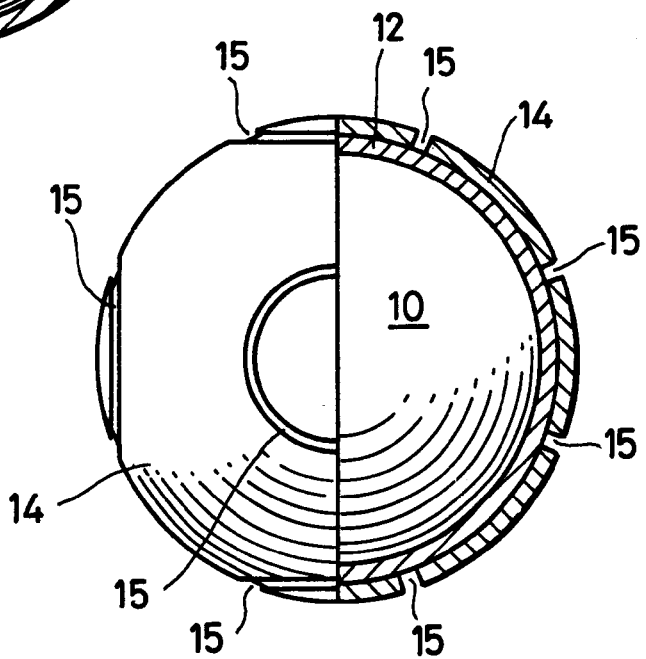

As shown in FIG. 3C, in the next process, electrode patterns 14 are formed, which are made of a conductive material layer 14, preferably, metal layer. Firstly, a metal layer 14 is formed to coat the silicon layer 12 all over. Then, electrode pattern grooves 15 are formed on the metal layer 14 by etching. The electrode pattern grooves 15 are formed in shape of six thin rings so that the respective shape thereof corresponds to the respective shape of the six electrodes 101–106. In this way, electrode patterns are formed inside the six ring grooves and a shield pattern is formed outside thereof.

However, the electrode patterns may be of any shape other than circle according to the present embodiment. The shield electrode pattern may be of any shape other than the present embodiment.

Figure 4A:
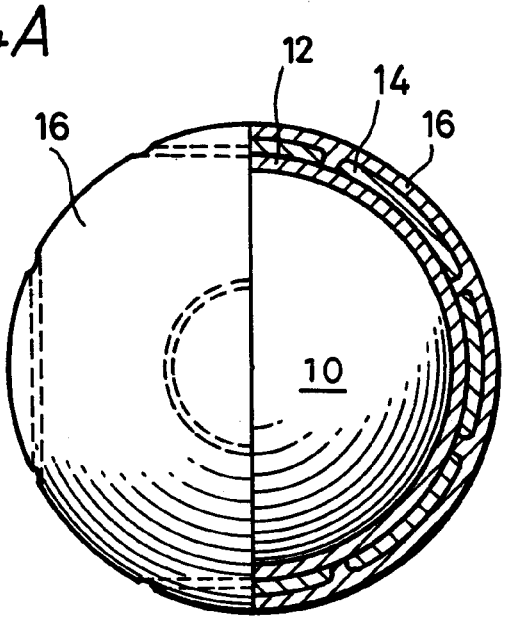
FIG. 4A, FIG. 4B and FIG. 4C are illustrative diagrams showing processes of the method according to the present invention.

As shown in FIG. 4A, an insulating material layer 16, for example, silicon dioxide ($SiO_2$) layer is then formed. This layer may be formed with TEOS(tetraethoxysilane) by chemical vapor deposition (CVD). In this process, the electrode pattern grooves 15 which have been formed in the process of FIG. 3C are filled with silicon dioxide ($SiO_2$).

Figure 4B:
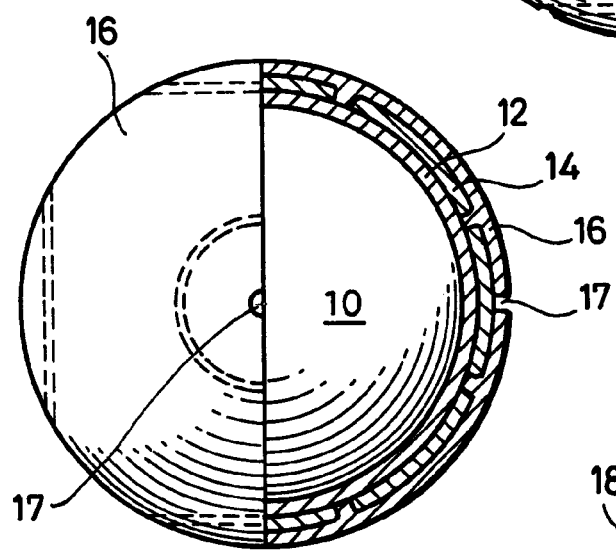

As shown in FIG. 4B, grooves 17 are then formed on the silicon dioxide layer 16 by etching. In the grooves 17, the conductive material layer 14 or metal layer 14 is exposed. The grooves 17 are made in order to form a conductive layer or metal layer for connecting between electrode patterns and terminal patterns. Accordingly, an appropriate number of the grooves 17 are formed at positions corresponding to the electrode patterns.

Figure 4C:
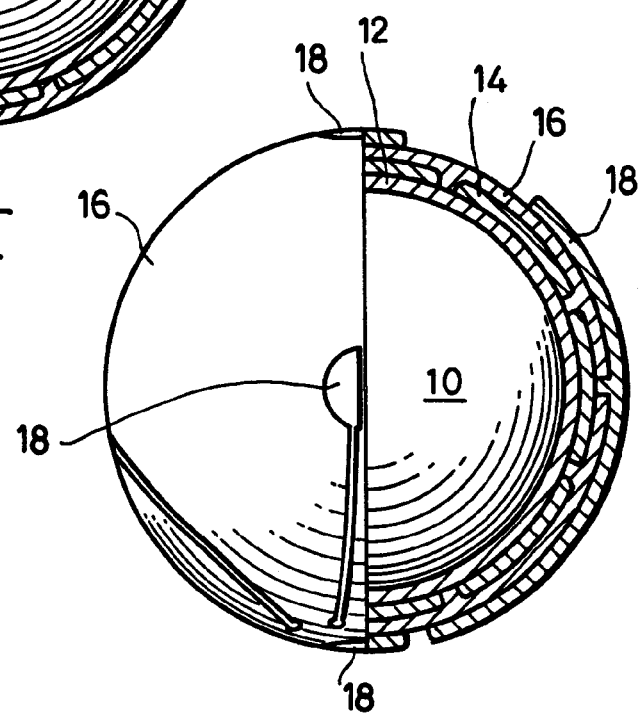

As shown in FIG. 4C, on the silicon dioxide layer 16, wiring patterns are then formed which consist of a conductive material layer 18, for example, metal layer. By this, terminal patterns and circuit patterns shown FIG. 2 are formed. In this process, the grooves 17 which have been made in the process of FIG. 4B are filled with the conductive material layer 18.

Figure 5A:
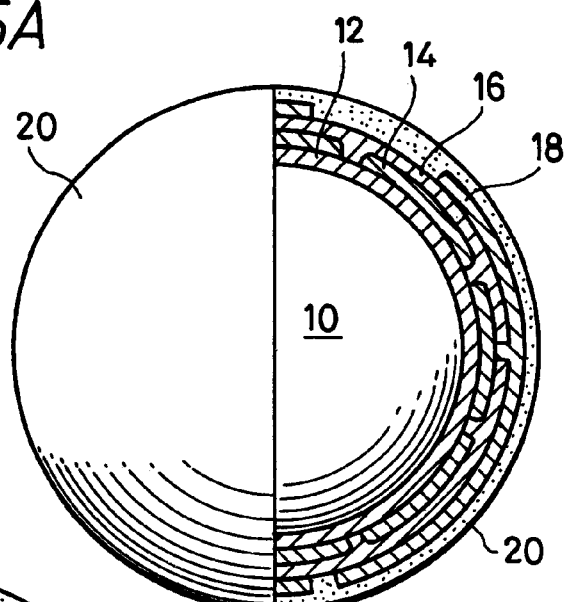
FIG. 5A, FIG. 5B and FIG. 5C are illustrative diagrams showing processes of the method according to the present invention.

As shown in FIG. 5A, a resist layer 20 is then formed. The resist layer 20 may be made of an appropriate thermosetting resin. A resin which is commercially available as EPON-SU-8 or polyimide resin may be used as thermosetting resin. The resist layer 20 is made in a thickness greater than those made by chemical vapor deposition (CVD).

After the resist coating is formed, grooves and microscopic bores are formed by lithography for the use of bump-forming and vapor etching respectively. As described in reference to FIG. 2B, the grooves for forming bumps are formed on the place corresponding to the ends of the circuit patterns 121–126, 127. A thermal treatment which is referred to as "hard bake" is then carried out to harden the resist. The resist resin layer thus hardened can protect the inner components and at the same time can provide the spherical shell 100 of the present embodiment with a structural strength.

Figure 5B:
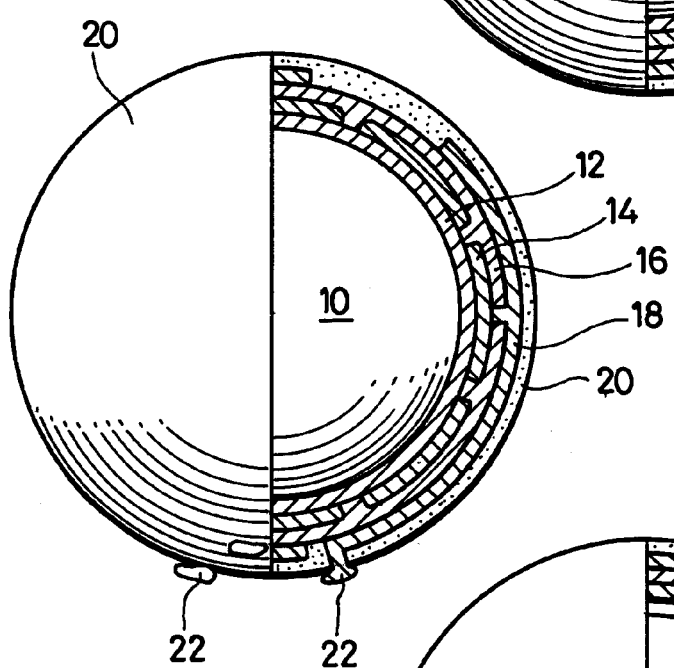

As shown in FIG. 5B, bumps 22 are then formed. As described above, grooves have been formed on the resist layer 20 by lithography and therefore the inner wiring patterns are partially exposed. Bumps 22 which consist of solder or the like are formed on the grooves. The spherical shell 100 having inside a spherical body 10 is then positioned on a printed circuit board which is not shown in the drawings, and the bumps are bonded to the circuit by thermal fusion bonding. In this way, the spherical shell 100 is bonded on the printed circuit board.

Figure 5C:
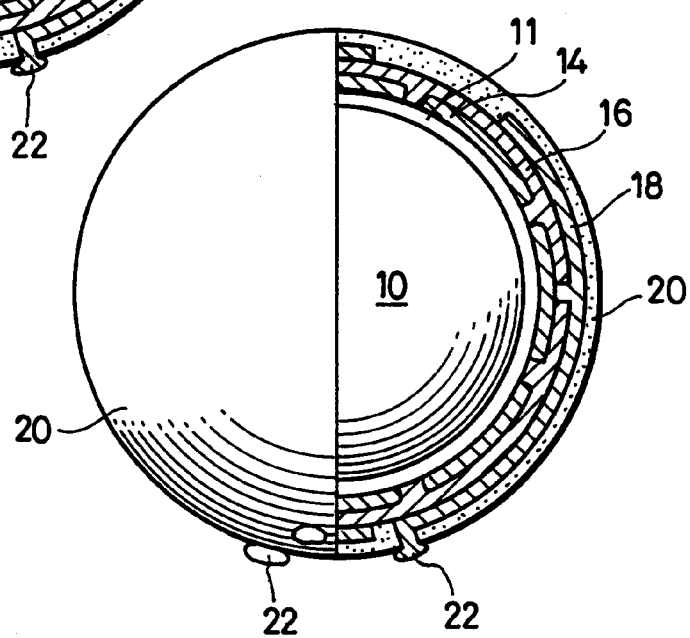

Finally, as shown in FIG. 5C, the victim layer 12 is removed to make a cavity or gap 11. According to the present embodiment, the removal of the victim layer 12 is carried out by using vapor etching. Hereinafter, the vapor etching or gaseous etching is described.

On the spherical shell 100 which has been made by the above described processes, microscopic bores will be formed which extend from the outer surface of the resist layer 20 to the victim layer 12. To form such microscopic bores will be described later. Etching gas is introduced through the microscopic bores to remove the victim layer 12. The etching gas removes only the victim layer 12 and does not react any other substances.

In vapor etching or gaseous etching, it is important to select a material of the victim layer to be removed and a most appropriate etching gas thereto. As an etching gas, a gas is selected which has a high selective reactivity to the victim layer. In the present embodiment, silicon is used as a material of the victim layer and xenon difluoride ($XeF_2$) is used as an etching gas.

Xenon difluoride ($XeF_2$) has three characteristics as follows:

(1) The selective reactivity to silicon is very high. Namely, xenon difluoride resolves simple substance of silicon but is inactive to other materials.

(2) Etching is a dry chemical reaction without liquid phase.

Namely, gaseous xenon difluoride resolves solid silicon but the resultant product is of gaseous phase.

(3) Etching is isotropic and etching reaction proceeds gradually.

Xenon difluoride ($XeF_2$) is solid at a room temperature and under atmospheric pressure, but is easily sublimated to change into gaseous phase under vacuum circumstances. Accordingly, vapor etching process according to the present embodiment is carried out under vacuum circumstances.

In the present embodiment, as described above, the spherical body 10 is made of silicon but the surface thereof is coated with any material other than silicon. Therefore, silicon of the spherical body 10 does not come into contact with etching vapor.

Figure 6:
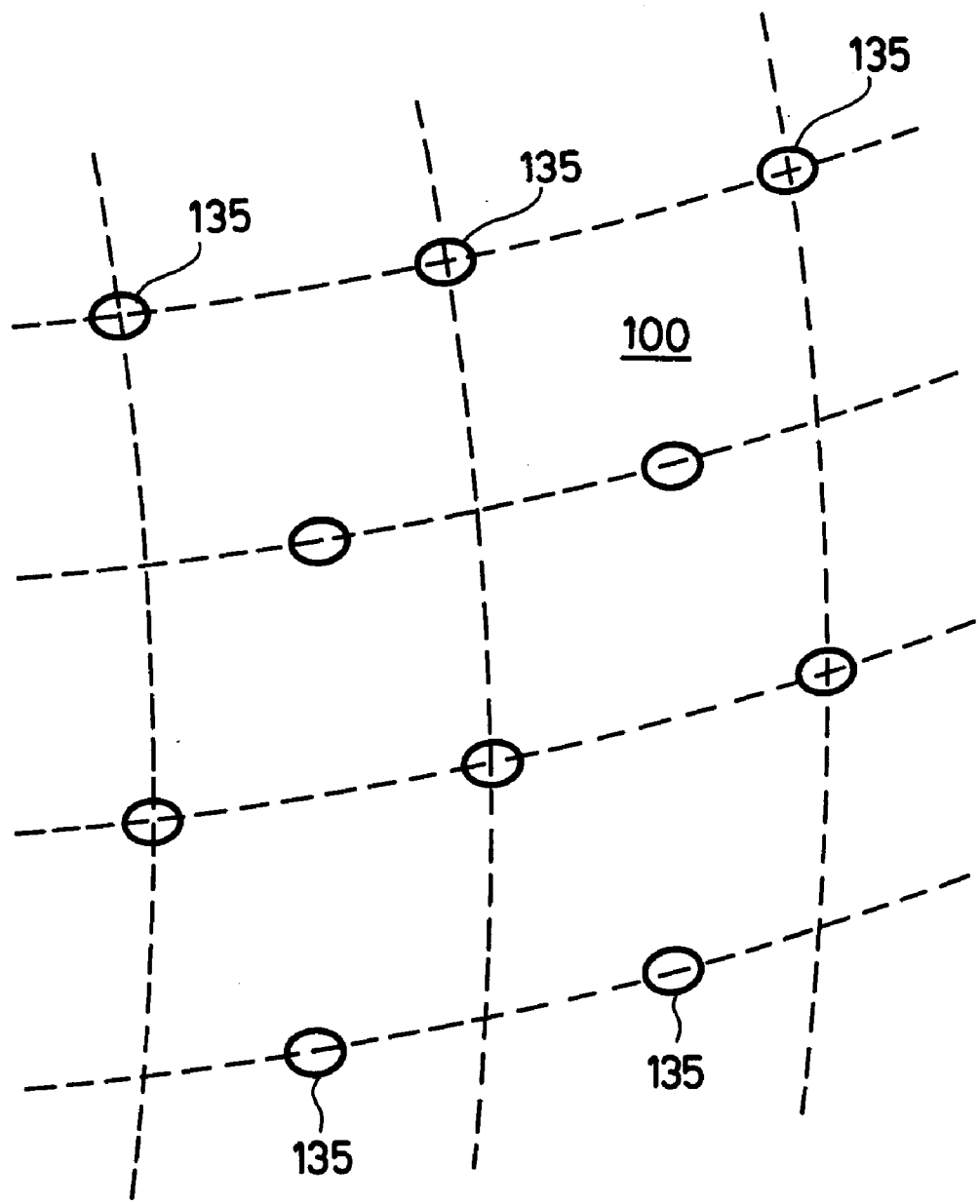
FIG. 6 is a partial view of the spherical shell of the micromachine which is made by the method of the present invention showing an embodiment of the microscopic bores.

Referring to FIG. 6, microscopic bores 135 for vapor etching is described. The microscopic bores 135 may be formed in every process described above. For example, in each process for making the conductive material layer 14, insulating layer 16, conductive material layer 18 or resist layer 20, microscopic bores may be formed on the previously formed layer. However, microscopic bores may be formed after all of the processes have been finished, or just before the vapor etching.

The microscopic bores 135 are formed on the conductive material layer 14, insulating material layer 16, conductive material layer 18 and resist layer 20 in turns. In order to make the microscopic bores be through holes extending from the outer surface of the resist layer 20 to the victim layer 12, the microscopic bores should be formed on the same points of each layer. Positioning process for making the microscopic bores may be performed by using such a positioning apparatus as used in making wiring patterns.

As shown in FIG. 6, a plurality of microscopic bores 135 are formed on the surface of the spherical shell 100 at a predetermined pitch. For example, assuming that the diameter of the spherical shell 100 is 1 mm and the pitch of the microscopic bores 135 is 100 μm, approximately 30 microscopic bores can be formed along the equator of the spherical shell 100.

In this way, by removing the victim layer 12 with etching, a gap 11 is made between the spherical body 10 and the spherical shell 100. This gap 11 is connected to outside of the spherical shell through the microscopic bores 135. This gap 11 may be filled with an appropriate liquid. The microscopic bores 135 may be closed by an appropriate method. Thereby the gap 11 becomes a hermetic space. As described above, the hermetic space may be evacuated or filled with an appropriate inert gas or liquid.

Although embodiments of the present invention are described above, it should be understood by one skilled in the art that the present invention is not limited by the above described embodiments and various other compositions can be taken without departing from the scope of the claims.

According to the present invention, it is advantageously possible to manufacture a spherical body and surrounding electrodes at the same time.

According to the present invention, it is advantageously possible to make a gap between a spherical body and surrounding electrodes precisely and easily.

According to the present invention, it is advantageously possible to make a spherical body and surrounding electrodes precisely although they are very small in size.

What is claimed is:

1. A method for making a micromachine, which includes a spherical body and a spherical shell surrounding said spherical body, comprising;

forming a victim layer on said spherical body to coat said spherical body, forming a function layer on said victim layer, said function layer including at least one conductive material pattern and/or insulating material layer, forming a structure layer of insulating material to coat said spherical body on which said function layer is formed, forming etching bores extending from the outer surface of said structure layer to said victim layer, introducing gaseous etchant into said etching bores to remove said victim layer.

2. The method as claimed in claim 1; said process for forming a function layer comprising;

forming conductive material patterns on said victim layer, forming an insulating material layer to coat said conductive material patterns, forming grooves on said insulating material layer to expose said conductive material patterns, forming circuit patterns on said insulating material layer to connect with said conductive material patterns exposed from said insulating material layer.

3. The method as claimed in claim 2, further comprising;

forming bores on said structure layer to expose said circuit patterns, forming bumps to connect with said circuit patterns exposed from said structure layer.

4. The method as claimed in claim 1 wherein said etching bores are formed by making bores on the same points in said process for forming a function layer and said process for forming a structure layer.

5. The method as claimed in claim 1 wherein said etching bores are made after said process for forming a structure layer.

6. The method as claimed in claim 1 wherein said victim layer is made of silicon, and said etchant is xenon difluoride.

7. The method as claimed in claim 1 wherein said structure layer is formed by thermal hardening a thermosetting resin.

8. The method as claimed in claim 2, said insulating material is made of silicon dioxide derived from TEOS.

9. A method for making a spherical body type sensor apparatus, which includes a spherical body and a spherical shell surrounding said spherical body comprising;

forming a victim layer on a spherical body to coat said spherical body, forming electrode patterns of a conductive material on said victim layer, forming an insulating material layer to coat said electrode patterns, forming bores on said insulating material layer to expose said electrode patterns, forming circuit patterns on said insulating material layer to connect with said electrode patterns exposed from said insulating material layer, forming an insulating structure layer to coat said spherical body on which said circuit patterns have been formed, forming a plurality of etching bores extending from the outer surface of said structure layer to said victim layer, introducing gaseous etchant into said etching bores to remove said victim layer.

* * * * *